United States Patent [19]
Cliff et al.

[11] Patent Number: 5,963,051
[45] Date of Patent: Oct. 5, 1999

[54] SEGMENTED LOCALIZED CONDUCTORS FOR PROGRAMMABLE LOGIC DEVICES

[75] Inventors: Richard G. Cliff; Chiakang Sung, both of Milpitas, Calif.

[73] Assignee: Altera Corporation, San Jose, Calif.

[21] Appl. No.: 08/837,117

[22] Filed: Apr. 14, 1997

Related U.S. Application Data

[60] Provisional application No. 60/021,431, Jul. 9, 1996.
[51] Int. Cl.⁶ .................................................. H03K 19/177
[52] U.S. Cl. ................................................. 326/41; 326/47
[58] Field of Search .................................. 326/37, 38, 39, 326/41, 47

[56] References Cited

U.S. PATENT DOCUMENTS 5,367,208  11/1994  El Gamal et al. ..................... 326/39
5,430,390  7/1995  Chan et al. ............................. 326/39
5,614,840  3/1997  McClintock et al. .................. 326/39

Primary Examiner—Jon Santamauro
Assistant Examiner—Don Phu Le
Attorney, Agent, or Firm—Fish & Neave; Robert R. Jackson; G. Victor Treyz

[57] ABSTRACT

A programmable logic array integrated circuit device having a two-dimensional array of logic array blocks is provided in which the localized conductors serving each logic array block are segmented. The localized conductors are logic array block conductors that convey signals from associated interblock conductors to logic elements in the logic array blocks and local conductors that convey signals between the logic elements. The localized conductor segments are connected to each other by programmable logic connectors.

7 Claims, 5 Drawing Sheets

SEGMENTED LOCALIZED CONDUCTORS FOR PROGRAMMABLE LOGIC DEVICES

This application claims the benefit of United States provisional application No. 60/021,431, filed Jul. 9, 1996.

BACKGROUND OF THE INVENTION

This invention relates to programmable logic devices. More particularly, this invention relates to localized conductors associated with logic array blocks on programmable logic devices.

Programmable logic array devices are integrated circuits that are programmable by a user to perform various logic functions. At their most basic level, programmable logic array devices contain programmable components, such as erasable programmable read-only (EPROM) transistors, electrically erasable programmable read-only (EEPROM) transistors, random access memory (RAM) transistors or cells, fuses, and antifuses. In order to provide higher level functions, the programmable components are organized into various groups of components that are electrically connected to one another by programmable interconnections.

Programmable logic array integrated circuit devices are described in commonly-assigned copending U.S. patent application Ser. No. 08/672,676, filed Jun. 28, 1996 and U.S. Pat. No. 5,689,195. U.S. patent application Ser. No. 08/672,676 and U.S. Pat. No. 5,689,195 show how small regions of logic called logic elements can be formed based on look-up table and register logic. Somewhat larger regions of logic called logic array blocks (LABs) are formed from the logic elements. Each logic array block contains eight logic elements. Logic array blocks are arranged in rows and columns on the programmable logic array device. Associated rows and columns of interblock conductors are used to interconnect the logic array blocks.

Each logic array block generally has two types of associated localized conductors used by the logic within that block. The first type of localized conductors are known as logic array block conductors. Logic array block conductors route signals from rows of horizontal interblock conductors onto logic element input conductors. The second type of localized conductors are known as local conductors. Local conductors primarily route output signals from the logic elements to the inputs of other logic elements within the same logic array block. The logic array block and local conductors run perpendicular to the input conductors of the logic elements in the block. Each logic array block conductor and local conductor has a programmable connection to each of the logic element input conductors in the logic array block.

There must be a sufficient number of logic array block and local conductors associated with each logic array block to implement logic designs of various sizes. In practice, a typical logic array block uses about 10 associated logic array block conductors to convey signals. However, in order to accommodate the largest logic designs that are encountered, it is necessary to provide about 20 logic array block conductors for each logic array block. Similarly, a typical logic array block has eight associated local conductors, even though fewer than eight local conductors are used to implement many logic designs. Providing numerous logic array block conductors and local conductors makes the localized conductor arrangement flexible enough to accommodate most desired logic designs. However, providing too many conductors per logic array block wastes interconnection resources, because a significant number of the conductors and programmable connections between conductors will remain unused in each block.

It is therefore an object of the present invention to provide an improved localized conductor arrangement for the logic array blocks on a programmable logic device.

SUMMARY OF THE INVENTION

This and other objects of the invention are accomplished in accordance with the principles of the present invention by providing a programmable logic array integrated circuit device having segmented localized conductors. The programmable logic device has an array of logic array blocks each of which has a number of logic elements. The logic array blocks are preferably interconnected with horizontal and vertical groups of interblock conductors.

The logic elements contain programmable logic such as look-up table or product term logic that allows each logic element to provide a selectable logic function of its inputs at its output. A group of segmented localized conductors is associated with each logic array block. The segmented localized conductors are of two types: (1) logic array block conductors that convey signals from the horizontal interblock conductors associated with each logic array block to the logic element inputs in that block and (2) local conductors that convey signals between the logic elements in a logic array block.

The segmented localized conductors are divided into at least two segments connected by a programmable connector based on, for example, an n-channel metal-oxide-semiconductor (NMOS) transistor driven by a random access memory (RAM) cell. If desired, each segmented localized conductor can be divided into more than two segments. Additional segments are connected by additional programmable connectors.

At least one of the localized conductors in the group of localized conductors associated with a given logic array block is segmented. If desired, all localized conductors can be segmented. Various circuit layouts may be used. If the segments of a segmented localized conductor form an individual vertically extending conductor, the programmable connection can be located in the middle of the segments. If the segments form pairs of conductors extending parallel to each other, the programmable connectors can be located at the bottom of each pair.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
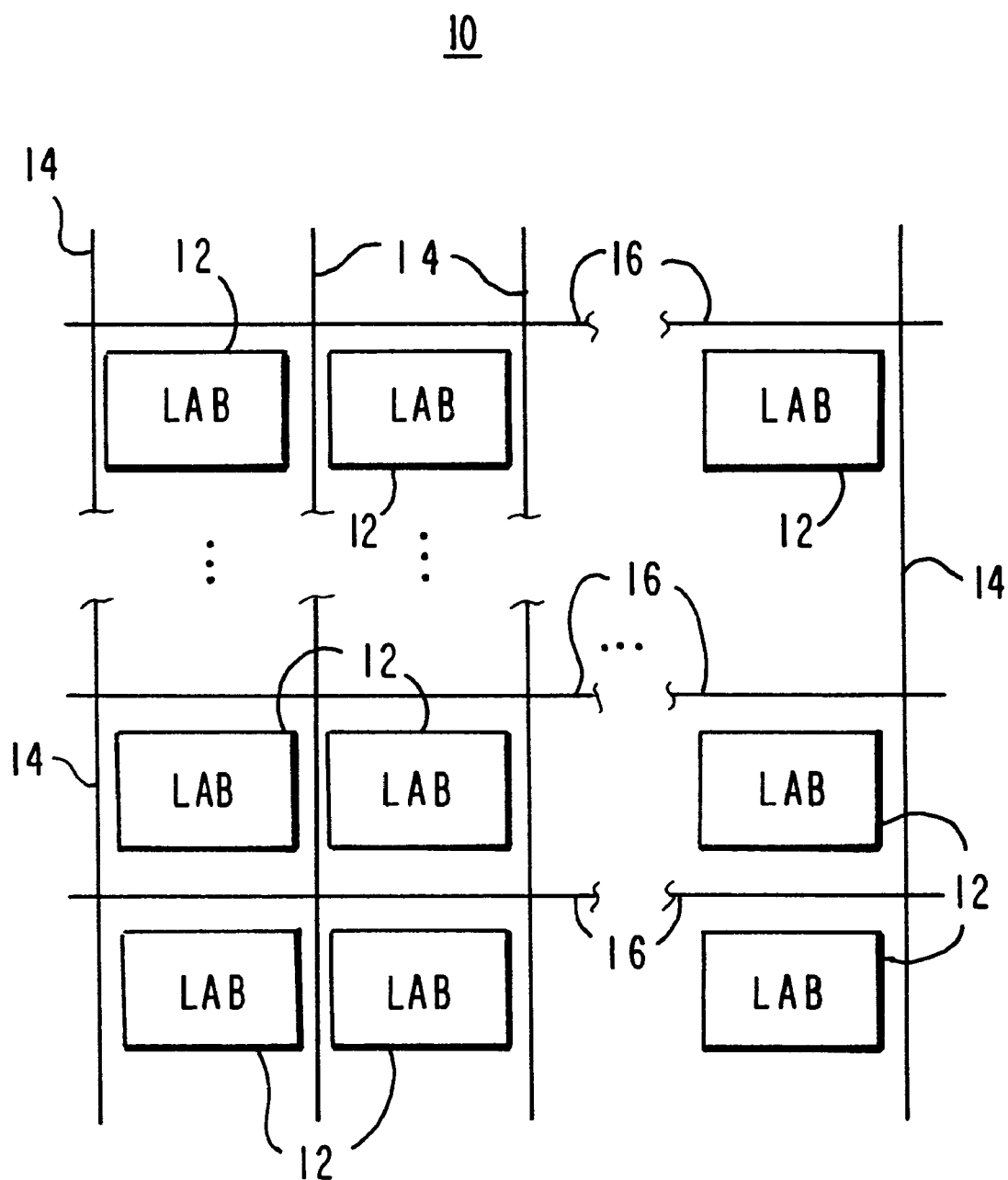
FIG. 1 is a circuit diagram of a programmable logic array integrated circuit constructed in accordance with the present invention.

An illustrative programmable logic array integrated circuit device 10 is shown in FIG. 1. Device 10 contains programmable logic that allow device 10 to be configured by users to perform various logic functions. Device 10 has groups of logic known as logic array blocks ("LABs") 12 arranged in a plurality of row and columns. A typical device 10 may have six rows and 24 columns of LABs 12.

Each column of LABs 12 has a plurality of associated vertical interblock conductors 14. Each row of LABs 12 has a plurality of associated horizontal interblock conductors 16. A typical device 10 may have 96 horizontal interblock conductors 16 in each row and 16 vertical interblock conductors 14 in each column. Programmable logic array integrated circuit devices are described in the above-mentioned commonly-assigned copending U.S. patent application No. 08/672,676, filed Jun. 28, 1996 and U.S. Pat. No. 5,689,195, which are hereby incorporated by reference herein.

Figure 2:
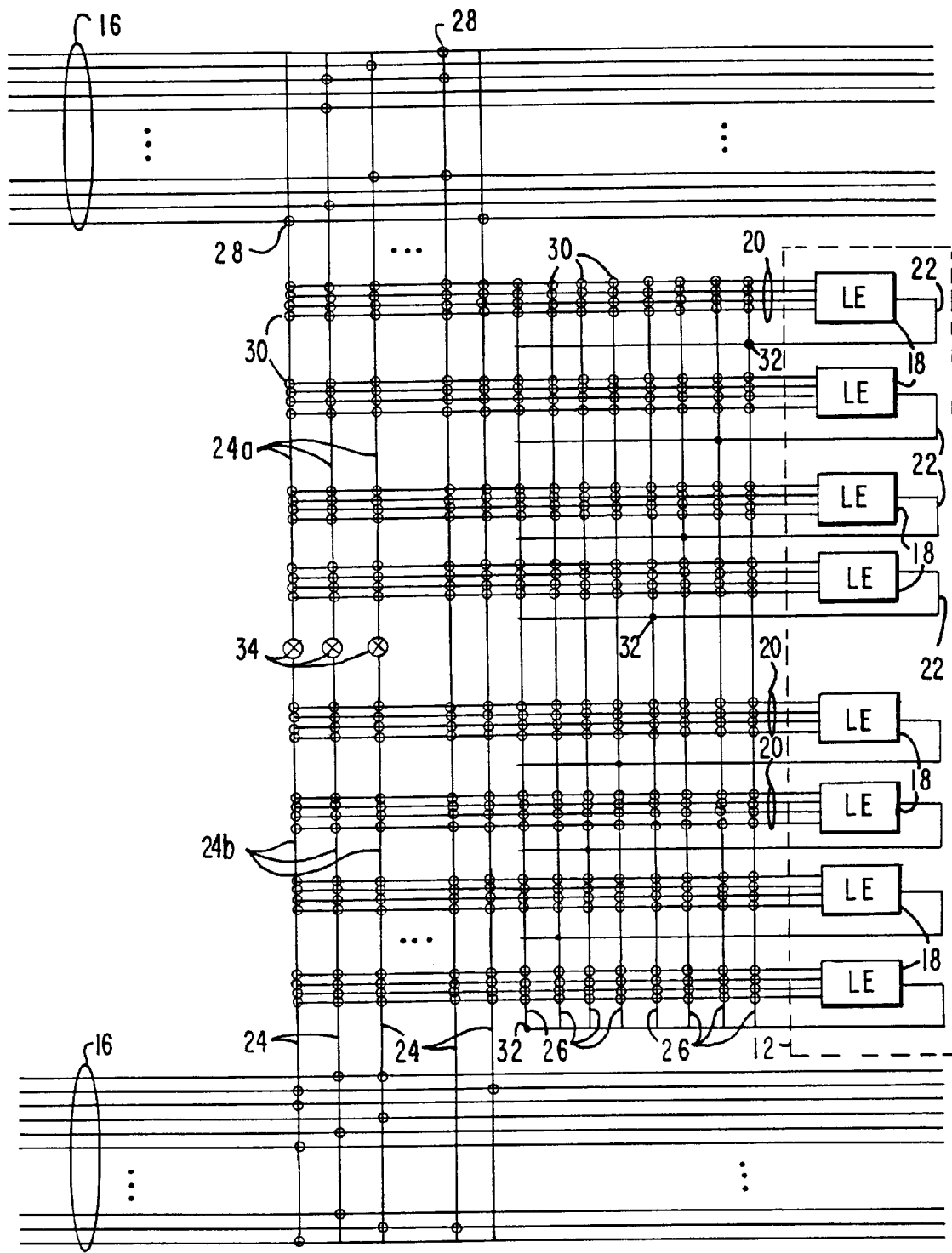
FIG. 2 is a circuit diagram of an illustrative logic array block and associated horizontal interblock and segmented logic array block conductors constructed in accordance with the present invention.

Each LAB 12 preferably includes eight logic elements (macrocells) 18, as shown in FIG. 2. Each logic element 18 preferably has four primary inputs 20 and at least one primary output 22. Logic elements 18 contain programmable logic that allows logic elements 18 to be programmed to produce any of several logic functions of inputs 20 at output 22. For example, each logic element 18 may include a four-input look-up table that can be programmed to produce any logical combination of its four inputs. In addition, each logic element 18 may include a register for selectively registering the output of the look-up table. This construction of a logic element is only illustrative, and many other constructions are equally possible. For example, logic elements 18 can alternatively be logic for forming a sum of products (i.e., so-called P-term logic). Each logic element 18 may also have many other features, such as the ability to function as one element in an arithmetic carry chain with adjacent logic elements, as described in Cliff et al. U.S. Pat. No. 5,274,581, which is hereby incorporated by reference herein. If desired, logic elements 18 may have the ability to function as one element in a cascade chain with adjacent logic elements, as described in Cliff et al. U.S. Pat. No. 5,258,668, which is hereby incorporated by reference herein.

Signals are conveyed to LAB 12 by horizontal interblock conductors 16 in the same row as LAB 12. Various layout schemes may be used. As shown in FIG. 2, it may be desirable to divide conductors 16 into two groups, one above LAB 12 and one below LAB 12. Interblock conductors 16 may extend continuously past all of the LABs 12 in a particular row (as global conductors) or may be segmented, for example, into halves, quarters, or eighths. If interblock conductors 16 are segmented, programmable logic connectors are preferably provided at the junctions between segments to selectively connect the segmented portions of the conductors together when it is desired to provide a signal communication path that is longer than an individual segment.

Signals may be conveyed out of LABs 12 using various structures, which are not shown in FIG. 2 to avoid overcomplicating the drawing. One suitable technique for conveying signals out of LABs 12 involves providing circuitry to drive vertical conductors 14 with signals from outputs 22. Circuitry may also be provided to drive horizontal conductors 16 with signals from outputs 22.

Regardless of the particular scheme used to convey signals out of LABs 12, each LAB 12 preferably has two types of associated conductors used solely by the logic within that block. These associated conductors are known as "localized conductors." The first type of localized conductors are logic array block conductors 24, which are used to route signals from interblock conductors 16 to input conductors 20 of logic elements 18. The second type of localized conductors are local conductors 26, which are used to route signals between logic elements 18 by connecting outputs 22 to inputs 20.

Conductors 24 are connected to interblock conductors 16 with programmable logic connectors ("PLCs") 28. PLCs 28 and other PLCs used throughout device 10 can be implemented in any of a wide variety of ways. For example, each PLC can be a relatively simple programmable connector such as a switch or a plurality of switches for connecting any one of several inputs to an output. Alternatively, each PLC can be a somewhat more complex element which is capable of performing logic (e.g., by logically combining several inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. The components of PLCs can be controlled by various, programmable, function control elements ("FCEs"), which are not shown separately in the accompanying drawings. With certain PLC implementations, such as fuses and metal optional links, separate FCE devices are not required. FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. Any of these technologies can also be used to implement other logic in device 10. From the various examples mentioned above, it will be seen that this invention is applicable both to one-time-only programmable and reprogrammable devices. However, for at least some features of the invention, the especially preferred embodiments tend to be reprogrammable because reprogrammable devices tend to benefit more from the economies of interconnection resources that result from the practice of this invention.

There are preferably two programmable connectors 28 between each of the 96 interblock conductors 16 in a row and logic array block conductors 24. Each logic array block conductor 24 is preferably connected to about 15 interblock conductors 16 (e.g., six to eight conductors 16 in the top half of conductors 16 and six to eight conductors 16 in the lower half of conductors 16 in FIG. 2). Preferably, connectors 28 are arranged in a pattern that provides redundancy, so that there are multiple signal pathways available. When the user configures programmable logic device 10 to perform a desired logic function, only some programmable logic connectors 28 will be programmed to form electrical connections between conductors 16 and conductors 24. However, providing redundant pathways reduces the possibility that all of the available pathways between a logic signal source and its intended destination will be blocked by previously programmed connections.

Logic array block conductors 24 and local conductors 26 are connected to logic element inputs 20 by programmable logic connectors 30. As shown in FIG. 2, the matrix of programmable logic connectors 30 is fully populated, because each intersection between logic block conductors 24 and local conductors 26 (which run vertically) and input conductors 20 (which run horizontally) is occupied by a programmable logic connector 30. Logic element outputs 22 are connected to local conductors 26 by fixed connections 32.

In accordance with the present invention, at least some of the localized conductors associated with logic array block 12 are segmented. For example, the three leftmost logic array block conductors in FIG. 2 are divided into upper half conductor segments 24a and lower half conductor segments 24b. Programmable logic connectors 34 are provided between upper half conductor segments 24a and lower half conductor segments 24b, but can be programmed to connect upper and lower segments 24a and 24b, if needed. Programmable logic connectors 34 are nominally in a state in which upper half conductors 24a are not electrically connected to lower half conductors 24b. During the configuration of programmable logic device 10, signal paths may be formed from upper interblock conductors 16 to the four uppermost logic elements 18 in FIG. 4 using upper half conductors 24a. Similarly, signal paths may be formed from lower interblock conductors 16 to the four lowermost logic elements 18 in FIG. 4 using lower half conductors 24b.

In contrast to previously known arrangements, in which all logic array block conductors 24 were unsegmented, the present arrangement allows two signals to be simultaneously routed by the upper and lower segments of a single logic array block conductor 24. Typically, most incoming signals have a fanout of one, so the three leftmost logic array block conductors 24 in FIG. 2 can potentially route six rather than three incoming signals to logic elements 18. Because segmented logic array block conductors 24a and 24b can route more signals than unsegmented logic array block conductors 24, it is possible to reduce the number of logic array block conductors 24 that are provided per logic array block. Previously known arrangements used approximately 20 unsegmented logic array block conductors 24 per logic array block 12, whereas arrangements using segmented logic array block conductors 24 (each having half conductors 24a and 24b) can use about 16 segmented logic array block conductors 24. Reducing the number of logic array block conductors 24 per logic array block 12 (and the associated programmable logic connectors 30) reduces the cost and complexity of providing the routing capabilities needed for logic array blocks 12.

Figure 3:
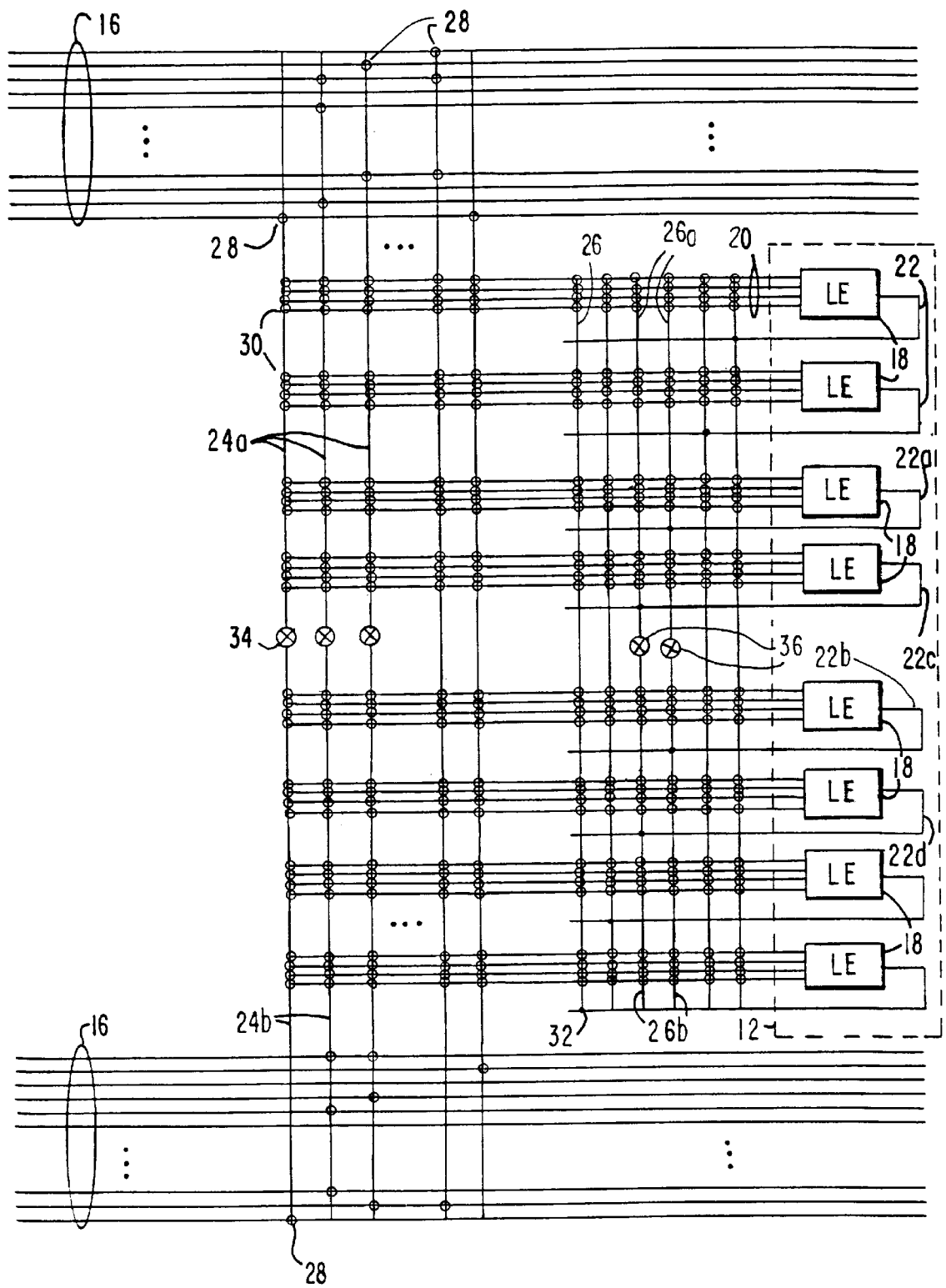
FIG. 3 is a circuit diagram similar to that of FIG. 2, showing the use of segmented logic array block conductors and segmented local conductors in accordance with the present invention.

In FIG. 2, only logic array block conductors 24 were segmented into halves 24a and 24b. If desired, however, local conductors 26 can be segmented as well. For example, local conductors 26 can be divided into upper local conductor segments 26a and lower local conductor segments 26b, as shown in FIG. 3. Fixed connections 32 in FIG. 3 are arranged so that logic element outputs 22a and 22b are connected to respective upper and lower segments 26a and 26b of the same local conductor. Similarly, logic element outputs 22c and 22d are connected to respective upper and lower segments 26a and 26b of the same local conductor. Programmable logic connectors 36 are provided to make it possible to reconnect upper local conductor segments 26a to lower local conductor segments 26b during device configuration.

Figure 4:
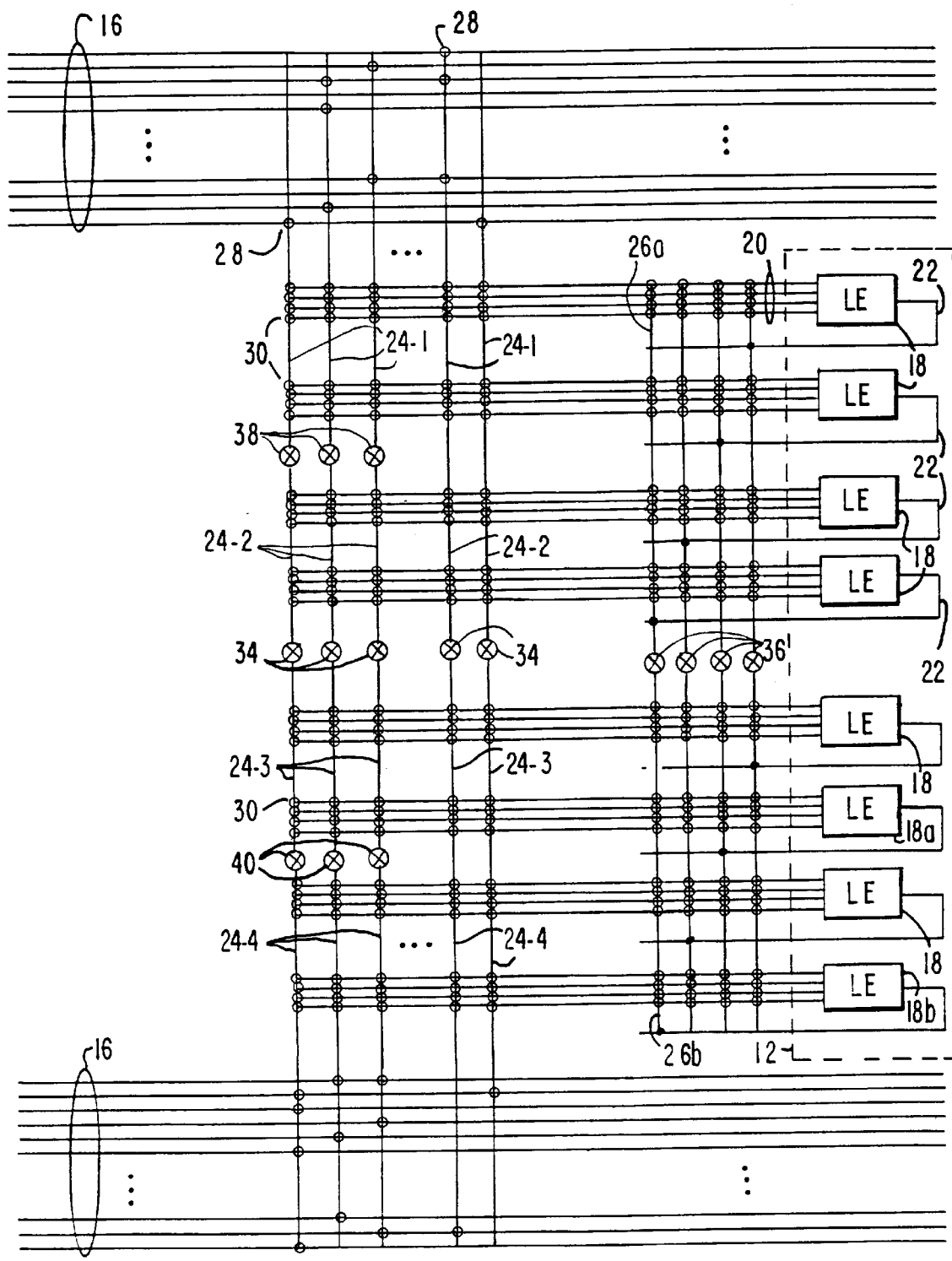
FIG. 4 is a circuit diagram showing how localized conductors can be segmented into more than two segments each in accordance with the present invention.

It is not necessary to segment all logic array block conductors 24 and local conductors 26. A predetermined number of the logic array block conductors or local conductors can be segmented. If desired, however, all logic array block conductors 24 and local conductors 26 can be segmented by providing a programmable logic connector 34 or 36 for each conductor 24 or 26, as shown in FIG. 4.

Further, conductors 24 and 26 can be segmented in more than one place. For example, conductors 24 can be segmented into quarter segments 24-1, 24-2, 24-3, and 24-4 by providing programmable logic connectors 38 and 40 in addition to programmable logic connectors 34. Such a configuration may be useful for providing added flexibility in routing signals. For example, if it were necessary to route a first signal from upper interblock conductors 16 to logic element 18a and a second signal from lower interblock conductors 16 to logic element 18b, the leftmost segments 24-1, 24-2, and 24-3 could be connected by the leftmost programmable logic connectors 38 and 34, while leaving the leftmost programmable logic connector 40 electrically open. The first signal would be available to the inputs 20 of logic element 18a and the second signal would be simultaneously available to the inputs 20 of logic element 18b. Segmenting conductors 24 and 26 into segments smaller than half segments may be particularly advantageous in situations in which about 16 ogic elements 18 are used per logic array block 12.

Figure 5:
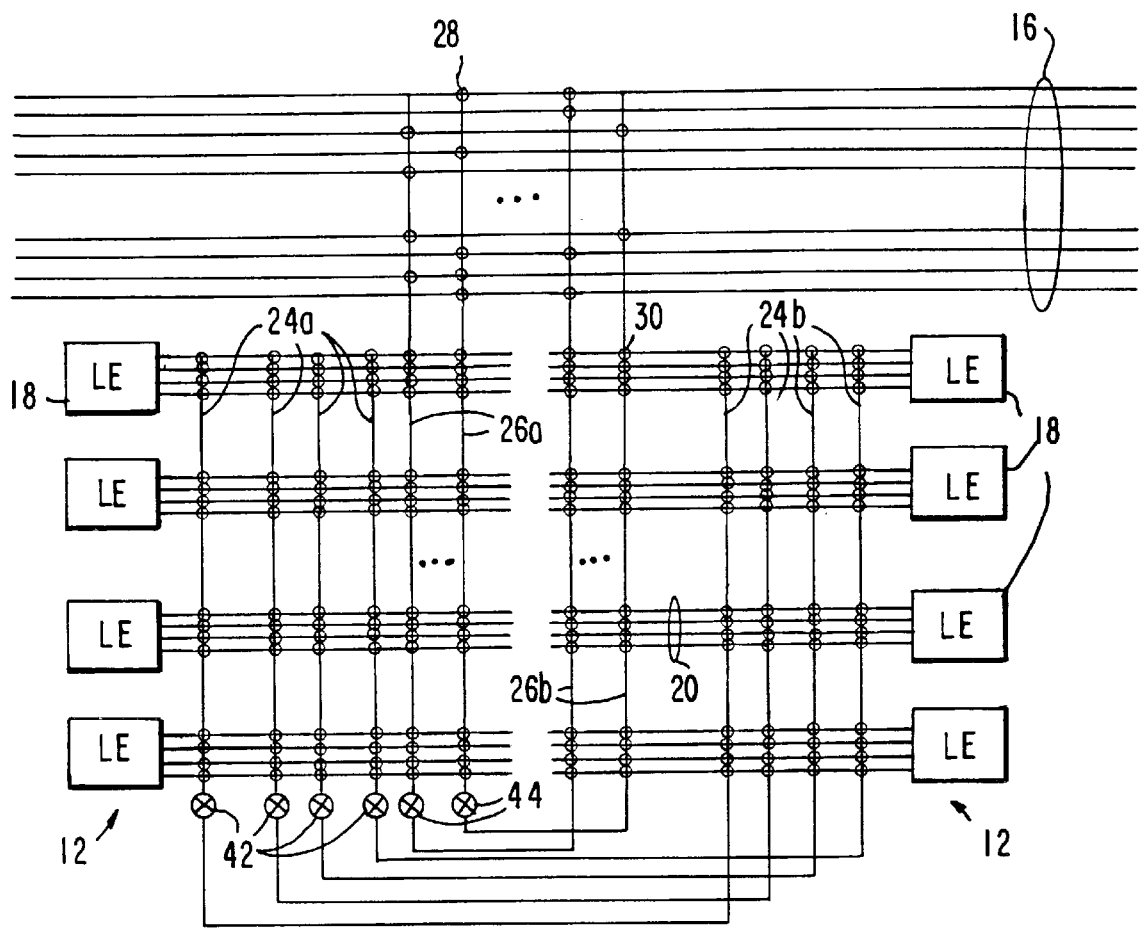
FIG. 5 is a circuit diagram showing a circuit layout in which programmable connectors are located at the bottom of each pair of localized conductor segments in accordance with the present invention.

Another possible arrangement with which to provide segmented conductors 24 and 26 is shown in FIG. 5. With the layout of FIG. 5, all of the interblock conductors 16 (of which there may be 96) are combined into a single row. Logic elements 18 are provided in two groups of four each. Logic array block 12 contains all eight logic elements 18. Programmable logic connectors 42 are provided at the bottom of each pair of local conductor segments 24a and 24b. Programmable logic connectors 44 are provided at the bottom of each pair of logic array block conductor segments 26a and 26b. The circuit layout of FIG. 5 may be more efficient to implement than the layouts of FIGS. 2–4.

The number of conductors 24 and 26 to segment is a matter of design choice that is influenced by the type of logic circuits that are to be implemented using programmable logic array integrated circuit device 10. There is a slight cost and complexity associated with segmenting conductors 24 and 26, because programmable logic connectors 34, 36, 38, 40, 42, or 44 must be provided. The design software used to configure the programmable logic device 10 must take the programmable logic connectors into account when determining how to interconnect the logic on device 10. There also is a small capacitance associated with each programmable logic connector, so adding a programmable logic connector to a conductor 24 or 26 tends to load the conductor 24 or 26 slightly.

Nevertheless, it is preferable to provide programmable logic connectors 34, 36, 38, 40, 42, and 44 when segmenting conductors 24 and 26, to permit the greatest routing flexibility possible. If conductors 24 and 26 were segmented without possibility of interconnection, it would add an unnecessary routing constraint, which might prevent some of the signals routed into a given logic array block 12 from being connected to the desired logic element 18. Providing programmable logic connectors makes it possible to route signals to any logic element 18 using segmented localized conductors, because conductor segments can be reconnected to form a full length conductor by programming the appropriate programmable logic connector.

Preferably, the software that implements logic designs on device 10 will, at least initially, be able to use conductor segments to route signals to their desired destinations (i.e., particular inputs 20 of logic elements 18), without forming connections between segments using programmable logic connectors 34, 36, 38, 40, 42, and 44. However, as conductor resources are consumed, and with certain high-fanout signals, it will be difficult or impossible to route a given signal to the proper logic element input 20 without using a full length conductor 24 or 26. At that stage, programmable logic connectors can be used to reconnect the conductor segments into full length conductors, thereby providing the necessary path. Because at least some of the signal pathways needed to implement a design on device 10 can be completed using the individual segments of a conductor 24 or 26, fewer conductors 24 and 26 are required per logic array block 12. Routing resources can be conserved without imposing additional routing constraints, because the segmented conductors can be reconnected to form full conductors, if needed.

The foregoing is merely illustrative of the principles of this invention and various modifications can be made by those skilled in the art without departing from the scope and spirit of the invention.

What is claimed is:

1. In a programmable logic device having a plurality of rows and columns of logic array blocks and a plurality of horizontal interblock conductors for each row of said logic array blocks, each of said logic array blocks containing a plurality of logic elements having logic element inputs and a logic element output, each logic element containing programmable logic for providing a selectable logic function of said logic element inputs at said logic element output, the improvement comprising:

at least one segmented localized conductor associated with each logic array block, each segmented localized conductor being connected to each of the logic element inputs in the associated logic array block by a programmable logic connector and having at least a first segment and a second segment, each of said segmented localized conductors extending past no more than one of said logic array blocks; and at least one programmable logic connector associated with each segmented localized conductor for electrically connecting said first and second segments.

2. The programmable logic device defined in claim 1, wherein each of said segmented localized conductors is a segmented logic array block conductor, the segmented logic array block conductors in each row being connected to the horizontal interblock conductors in the same row by a plurality of programmable logic connectors.

3. The programmable logic device defined in claim 1, wherein each of said segmented localized conductor is a segmented local conductor, the segmented local conductors associated with each logic array block being connected to the logic element outputs of the logic elements in that logic array block by fixed connections.

4. The programmable logic device defined in claim 1, wherein the first and second segments form individual vertically extending conductors and the programmable logic connectors that connect the first and second segments are located in the middles of the individual vertically extending conductors.

5. The programmable logic device defined in claim 1, wherein the first and second segments form pairs of conductors in which the first and second segments run parallel to each other and the programmable logic connectors that connect the first and second segments are located at the bottom of the pairs of conductors.

6. The programmable logic device defined in claim 1, wherein each logic array block contains a plurality of segmented logic array block conductors and a plurality of segmented local conductors.

7. The programmable logic device defined in claim 1, wherein the segmented localized conductor contains at least one additional segment connected to the first and second segments by a programmable logic connector.

* * * * *